United States Patent [19]

Wang et al.

[11] 4,367,429
[45] Jan. 4, 1983

[54] ALLOYS FOR LIQUID METAL ION SOURCES

[75] Inventors: Victor Wang, Agoura; Joseph A. Wysocki; Gregory L. Tangonan, both of Oxnard; Robert L. Seliger, Agoura, all of Calif.

[73] Assignee: Hughes Aircraft Company, Culver City, Calif.

[21] Appl. No.: 203,294

[22] Filed: Nov. 3, 1980

[51] Int. Cl.$^3$ .......................... H01J 1/05; H01J 27/26
[52] U.S. Cl. ................................ 313/362.1; 313/163; 313/232; 313/230
[58] Field of Search ...................... 313/362.1, 232, 163, 313/230

[56] References Cited

U.S. PATENT DOCUMENTS

| | | | |
|---|---|---|---|
| 4,318,029 | 3/1982 | Jergenson | 313/362.1 X |
| 4,318,030 | 3/1982 | Jergenson | 313/362.1 X |
| 4,328,667 | 5/1982 | Valentian et al. | 313/163 X |

Primary Examiner—Palmer C. Demeo
Attorney, Agent, or Firm—David W. Collins; A. W. Karambelas; W. H. MacAllister

[57] ABSTRACT

Alloys suitable for use in liquid metal field ionization ion sources are provided. Such sources include an anode electrode for supporting an ion emitter comprising an alloy in the liquid state. The source further comprises means for generating an ionizing electric field and a reservoir for the liquid metal, ions of which are to be emitted by the source.

The alloys are selected from the group consisting of (a) metal-metalloid alloys comprising about 10 to 30 atom percent of at least one metalloid element, the balance at least one transition metal element, (b) early transition-late transition alloys comprising about 30 to 85 atom percent of at least one early transition metal, the balance at least one late transition metal, and (c) Group II alloys comprising about 35 to 80 atom percent of at least one Group II element, the balance at least one metal element.

Ions generated in liquid metal ion sources form a high brightness ion beam, which permits focusing a beam of emitted ions to a submicrometer spot. The ions may be used to alter material properties by ion implantation such as to dope semiconductors, to form ohmic contacts, to improve wear and corrosion resistance in metal surfaces and by sputter etching thin films such as metals, dielectrics and semiconductors.

16 Claims, 5 Drawing Figures

ALLOYS FOR LIQUID METAL ION SOURCES

The U.S. Government has rights in this invention pursuant to Contract No. 78G112080.

BACKGROUND OF THE INVENTION

1. Field of the Invention

This invention relates to ion sources, and, more particularly, to alloys for liquid metal ion sources.

2. Description of the Prior Art

High brightness sources are sources with a small virtual source size and emit ions at high current density. There are two types of field-ionization sources that offer the high brightness needed for focusing ion beams to a submicrometer spot size—the gas field ion (GFI) source and the liquid metal (LM) ion source. The two sources differ in the mechanism used to feed atoms into the ionizing region. In the field-emission microscope, developed during the early 1950's, the ion source is based on gas field ionization in the immediate vicinity of an extremely shart submicrometer-radius point. The GFI source has an extremely small virtual source size—typically less than 100 Å. Since the source of ions is a gas at a pressure of a few micrometers of Hg, the number of atoms available for ionization is limited by the arrival rate of atoms in the vicinity of the small needle. The maximum gas pressure is limited by electrical breakdown of the gas. Since the process occurs on or near a very small surface, a surface that is subjected to a very high electrical field (about 1 V/Å) and to very high mechanical stress, this type of source is very sensitive to contaminants and sputtering effects that might dull the needle A recent breakthrough in high-brightness sources was the exploitation of the LM type of field-ionization source by Clampitt in U.S. Pat. No. 4,088,919. In this source, a relatively dull needle is covered by a layer of liquid metal such as an alkali metal. The application of a strong field causes the liquid metal to form a cusp, and this cusp becomes the emitting point of the source, emitting alkali ions such as lithium. The salient advantage of the LM source is its electrostatically shaped point, which is relatively insensitive to contaminants and such effects that might dull a solid metal point. The source is also notable for an ability to deliver relatively high current.

Other liquid metal sources are discussed in U.S. Pat. No. 3,579,011, which employs mercury as the liquid metal, and U.S. Pat. No. 3,475,636, which discloses a forced-flow, gravity-independent liquid metal arc cathode that includes a pool-keeping structure and is provided with a passage way means for feeding liquid metal to the pool-keeping structure. These two patents are described as being useful in ion thruster applications. U.S. Pat. No. 3,475,636 discloses employing mercury, gallium and cesium in a liquid metal arc cathode. All of these references, however, disclose electron sources, not ion sources.

There are applications requiring either the generation of multiple ionic species or the generation of an ionic species, the element of which has such a high vapor pressure in its liquid state that it is unsuitable for use in the systems described above.

The requirement for a liquid is basic to the LM source—the material to be ionized must be a liquid and it should have a reasonably low vapor pressure in the liquid state. Excessive thermal evaporation of atoms from the source would tend to both contaminate the system and deplete the source.

SUMMARY OF THE INVENTION

In accordance with the invention, an improved liquid metal ion source is provided. The liquid metal ion source comprises an anode electrode for supporting an ion emitter comprising an alloy in the liquid state. The electrode has a termination such that at least one cusp of liquid metal will form under the influence of an electric field. The source further comprises means for generating an ionizing electric field and a reservoir for the liquid metal, ions of which are to be emitted by the source. The alloys suitable for use in liquid metal sources are selected from the group consisting of (a) metal-metalloid alloys comprising about 10 to 30 atom percent of at least one metalloid element, the balance at least one transition metal element, (b) early transition-late transition alloys comprising about 30 to 85 atom percent of at least one early transition metal element, the balance at least one late transition metal element, and (c) Group II alloys comprising about 35 to 80 atom percent of at least one Group II element, the balance at least one metal element. The alloy composition must be one which exists as a single phase in the liquid state.

The alloys provided herein are suitable for generating multiple ionic species simultaneously, such as boron and arsenic. Alternatively, these alloys are suitable for generating an ion beam of a species whose vapor pressure would ordinarily be too high in elemental form to be used in the ion generating apparatus disclosed above. An example of such a species is arsenic.

DETAILED DESCRIPTION OF THE INVENTION

There are many potential applications employing the alloys provided in accordance with the invention in liquid metal ion sources. One such application, described herein in detail, involves the use of focused ion beam technology for the fabrication of semiconductor microcircuits. Briefly, such technology employs maskless fabrication techniques for the direct writing of transitors and integrated circuits, including techniques for focused ion beam implantation, micromachining and resist exposure that are of sufficiently high resolution (e.g., 1,000 to 5,000 Å). Liquid metal ion sources, such as the gallium ion sources, are known to be suitable for providing the high brightness and small virtual source size needed for focusing an ion beam to a submicrometer spot size.

Focused-ion-beam microfabrication provides one way to meet the requirements of submicrometer transistor fabrication. This technology has the potential for precise, repeatable dosage of dopants and for considerable reduction in the number of wet process steps. The technology's capability for doping and ion milling of semiconductors could greatly simplify transistor fabrication and improve the repeatability and yield of small production runs. Focused-ion-beam microfabrication should also facilitate research on advanced devices on an expedient and cost-effective basis.

Figure 1:
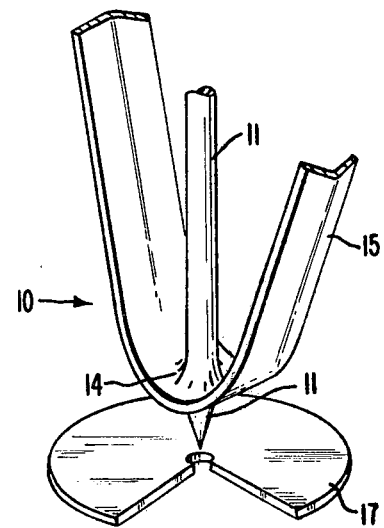
FIG. 1 depicts a liquid metal field ionization source.
Figure 3:
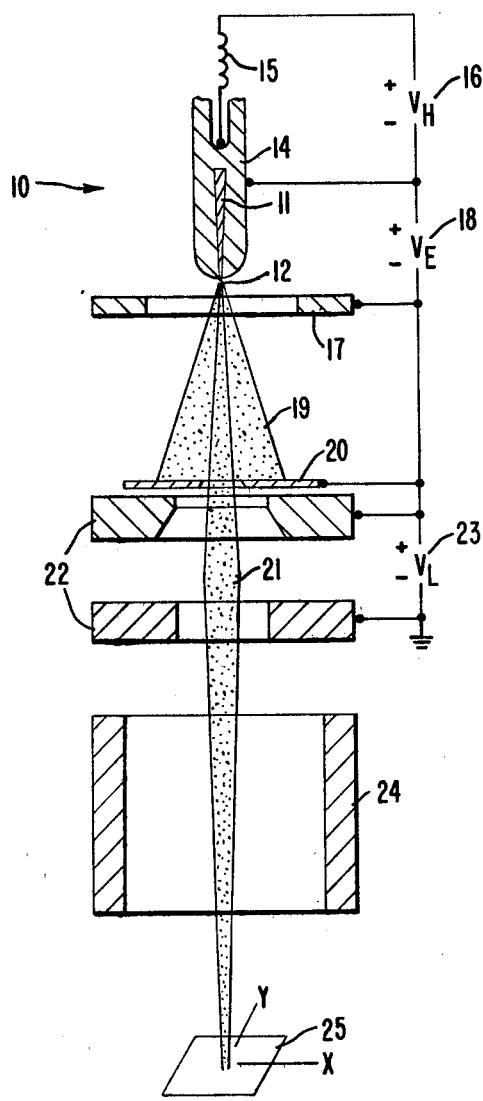
FIG. 3 depicts a schematic diagram of a scanning ion probe employing a liquid metal ion source.
Figure 2:
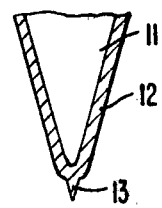
FIG. 2 depicts, in cross section, an enlarged portion of FIG. 1.

The basic elements of a focused-ion-beam microfabrication system are illustrated in FIGS. 1-3. A liquid metal ion source delivers a beam of charged particles, which is then focused by a lens or lens system. The focused beam is scanned across a semiconductor wafer by a deflector to directly "write" transistors or microcircuits. If the ion-beam species is that of a semiconductor dopant such as boron or arsenic, planar conducting regions of positive or negative charge carriers, respectively, can be formed by the direct implantation of the dopant ions into the crystal lattice of the substrate. This new approach is in contrast to conventional fabrication by photolithography, where circuits are defined by multiple maskprocessing steps, and dopants are then implanted by a broad ion beam or diffused into the crystal at high temperature through masks.

In addition to doping, ion-beam micromachining (or sputter etching) of selected areas can be accomplished by the high-energy ion beam. Through momentum exchange with the incident ions, metal layers, dielectrics, or the substrate itself can be sputtered away to form the fine lines that delineate a transistor structure.

The properties of other materials may also be altered. Dielectrics may be exposed to the liquid metal ion source of the invention to sputter etch material, to introduce damage into the dielectric material or to introduce dopants. Each of these techniques may be used, for example, to alter the index of refraction of a waveguiding layer in a surface acoustic wave device. Metals may be sputter etched to delineate interconnects, contacts and electrodes. The wear resistance and corrosion resistance of materials may be improved by ion implantation from liquid metal ion sources. These and other property alteraltions may be effected by use of liquid metal ion sources.

An example of a liquid metal ion source 10, shown in FIGS. 1 and 2, comprises a relatively dull needle (anode electrode) 11 covered with a layer of liquid metal 12. The application of a strong field (by means not shown) causes the liquid metal to form a cusp 13, shown in FIG. 2, which is an enlargement of a portion of FIG. 1. The cusp is the emitting point of the source, emitting ions from the liquid metal. This source can deliver relatively high current and has the advantage of an electrostatically-shaped point, which is relatively insensitive to contaminants and other such effects that might dull a solid metal point such as employed in a gas field ionization source. A reservoir 14 for the liquid metal is also provided; the liquid metal is maintained at a temperature slightly above its melting point by heating means 15. A heat shield (not shown) surrounds the entire assembly. The heating means is controlled by means 16 (FIG. 3). An extraction electrode 17, which may or may not be grounded, is also provided, which pulls ions out of the source and is controlled by voltage means 18.

Anode electrode 11 may be configured in the form of a solid blunt needle, capillary, knife edge or slit or an array of the foregoing. The extraction electrode 17 may be altered approximately to pass the emitted ions. Examples of multiple emitter sources are disclosed in U.S. Pat. No. 4,088,919.

As shown in further detail in FIG. 3, ions are emitted in a beam 19. The source 10 shown has the same elements as FIGS. 1 and 2, but has a different configuration. The ion beam may be manipulated in various ways to focus it or to remove undesired species. As an example, and as shown in FIG. 3, the ion beam is defined by aperture 20 to form ion beam 21 and passed through accelerating lens electrodes 22, controlled by voltage means 23, and through electrostatic deflection electrodes 24, where the beam is shaped and moved in a scanning fashion across the surface of target 25.

Apparatus such as depicted in FIG. 3 for providing a beam of ions may be modified by installing a mass separator, for example, after the extraction electrode. This permits mass separation of the ion beam, for example, to permit only one species of a multi-species ion beam to impinge on the traget. It also permits measurement of the percentage of the emitted species from a source of multiple ionic species.

In accordance with the invention, the liquid metal employed in the liquid metal ion source comprises an alloy selected from the group consisting of (a) metal-metalloid alloys comprising about 10 to 30 atom percent of at least one metalloid element, the balance at least one transition element, (b) early transition-late transition alloys comprising about 30 to 85 atom percent of at least one early transition metal element, the balance at least one late transition metal element, and (c) Group II alloys comprising about 35 to 80 atom percent of at least one Group II element, the balance at least one metal element.

Examples of metalloid elements suitable for use in metal-metalloid alloys include aluminum, arsenic, boron, carbon, germanium, indium, phosphorus, silicon and tin. The transistion elements are those elements comprising Columns IB-VIIB and VIII of Rows 4, 5 and 6 of the Periodic Table of Elements and include the lanthanide and actinide series. Examples of such alloys include $Pd_{80}Si_{20}$, $Ni_{80}P_{20}$, $Fe_{80}P_{20}$, $Pt_{75}P_{25}$, $Ni_{40}Pd_{40}B_{20}$, $Pt_{80}B_{20}$, $Pt_{72}As_{28}$, $Ni_{40}Pd_{40}B_{10}As_{10}$, $La_{80}C_{20}$, $Au_{82}Si_{18}$ and $Au_{73}Ge_{27}$ (the subscripts represent atom percent). Examples of preferred alloys suitable in the practice of the invention include $Ni_{40}Pd_{40}B_{20}$, $Pt_{80}B_{20}$, $Pt_{72}As_{28}$, $Ni_{40}Pd_{40}B_{10}As_{10}$, $La_{80}C_{20}$, $Au_{82}Si_{18}$ and $Au_{73}Ge_{27}$.

The second group of alloys (early transition-late transition alloys) is often referred to as the inner-transition alloys. Examples of early transition metals include zirconium, niobium, tantalum and titanium, while examples of late transition elements include iron, cobalt, nickel, copper and palladium. Examples of such alloys include $Zr_{60}Fe_{5}Cu_{35}$, $Zr_{75}Fe_{20}Ni_{5}$, $Zr_{55}Cu_{5}Ni_{40}$, $Zr_{60}Ti_{20}Fe_{20}$ and $Zr_{35}Ti_{20}Cu_{45}$.

Examples of Group II elements for use in the third group of alloys include beryllium, calcium, magnesium and zinc. Examples of metals which form deep eutectic alloys with the Group II elements include other Group II elements, aluminum, titanium, zirconium, hafnium and gold. Examples of such alloys include $Mg_{20}Cu_{80}$, $Zn_{75}Cu_{25}$, $Be_{40}Hf_{60}$, $Be_{55}Ti_{20}Zr_{25}$ and $Be_{50}Au_{50}$. An example of an alloy suitable in the practice of the invention is $Be_{50}Au_{50}$.

The liquid metal alloy must exist as a single phase in the liquide state, since immiscible alloys would not give predictable emission. There may be some alloys in the foregoing groups that fail to meet this requirement. However, simple experimentation will readily indentify such alloys, which are not included within the scope of the invention.

As is well-known from metallic glass technology, such compositions described above evidence deep eutectics over the concentration ranges disclosed and, accordingly, evidence considerably lower melting points than any of the elemental constituents alone. Since high temperatures tend to result in high vapor pressure, the low melting point alloys provided herein are useful in liquid metal ion sources.

For example, the basic difficulty with employing boron in prior art liquid metal ion sources is the high melting point of elemental boron (2,200° C.). On the other hand, a ternary eutectic alloy in the Pd-Ni-B system has a melting point of 675° C. Mass separation in apparatus similar to that described above indicated that 16% of a beam generated from a liquid metal source of Pd-Ni-B consisted of the isotope $^{11}B^+$.

Deep eutectic alloys also evidence a considerably lower vapor pressure than that of the consitituent element having the highest vapor pressure, and thus the problems associated with attempting to field ionize a species having a high vapor pressure are avoided. Preferably, the vapor pressure of the alloy at its melting point is less than about $10^{-5}$ Torr.

For example, a liquid metal ion source employing arsenic is difficult to realize because of the high vapor pressure of arsenic at its melting point of about 820° C. However, this high vapor pressure may be strongly suppressed by employing a Pd-Ni-As-B alloy, for which no loss of arsenic was observed at an operating temperature of 800° C. A special attraction of this quaternary alloy is the possibility of extracting both boron and arsenic ions from the same alloy.

The alloys of the invention are conveniently prepared by mixing powders of the constituents in the requisite amounts, pressing and firing above the melting point in a reducing atmosphere for a period of time sufficient to form a homogeneous mass. The purity of the constituents may be that employed in normal commercial practice.

In instances where it is desired to employ only one or a few ionic species of a multicomponent alloy, it is preferred that the masses of the desired species be considerably different from those of the undersired species. Such disparity in mass permits use of a weak mass separator to allow only those desired species to pass through to a target. For example, liquid metal ion sources may be used to implant ions into semiconductor devices. Typically, such ion implanted species are boron or arsenic. Thus, an example of a composition of the invention suitable for implanting boron consists essentially of $Ni_{40}Pd_{40}B_{20}$; another suitable alloy consists essentially of $Pt_{80}B_{20}$. Arsenic ions may be implanted from an alloy consisting essentially of $Pt_{72}As_{28}$. Boron and arsenic ions may be simultaneously emitted employing an alloy consisting essentially of $Ni_{40}Pd_{40}As_{10}B_{10}$.

Another use of liquid metal source is to form ohmic contacts on semiconductor surfaces. For example, ohmic contacts for GaAs semiconductors presently utilize an eutectic mixture of Au-Ge (356° C. m.p.). This contact is evaporated on the substrate, and a thin retaining overcoat of nickel is evaporated over this. The structure is then alloyed by an anneal at 450° C. The poor wettability of Au-Ge on GaAs would ordinarily cause balling of the Au-Ge upon melting, resulting in irregular contacts. The function of the nickel is to maintain the contact of the Au-Ge alloy until the Ge can diffuse into the surface. However, this process is not always completely satisfactory. Implantation of an Au-Ge alloy consisting essentially of $Au_{73}Ge_{27}$, followed by an anneal, may be used to form ohmic contacts. In such a situation, mass separation would not be employed. The gold and germanium are emitted in approximately the stoichiometric ratio of the eutectic composition (as desired).

EXAMPLES

A. Preparation of Alloys

Example 1: $Pd_{40}Ni_{40}B_{20}$

Powders (200 mesh) of the respective elements were mixed in the following amounts (weight percent): 62.4% palladium, 34.4% nickel and 3.2% boron. Small pellets about 100 mg were formed by pressing the powders to at least about 50 kpsi. The pellets were fired at 1,000° C. for 5 min in a hydrogen furnace. After firing, the pellets were in the form of substantially spherical metallic balls, having substantially uniform composition throughout. The pellets could then be fractured into small pieces or fashioned into foil by melting and splat cooling on copper anvils, employing well-known splat cooling processes.

Example 2: $Pd_{40}Ni_{40}As_{10}B_{10}$

Powders of palladium, nickel and boron were mixed as in Example 1, employing 57.0% palladium, 31.5% nickel and 1.5% boron. The powders were pressed into pellets and fired as in Example 1. Arsenic (10.0%) in ultra-pure chunk form to minimize oxidation was placed in a small quartz ampoule, together with the fired pellets. The ampoule was evacuated with a mechanical roughing pump and sealed off with a torch, taking care not to heat arsenic during the sealing process. The sealed ampoule was placed in a temperature controlled oven and heated to between 750° and 775° C. for about 10 min until the arsenic dissolved. The ampoule was then cooled to room temperature and opened. The resulting pellet was a shiny sphere which could be fractured into smaller pieces for loading into a liquid metal ion source.

Example 3: $Pt_{72}As_{28}$

The repsective elements (87.0% platinum, 50 mesh powder, and 13.0% arsenic, chunk) were placed in a heavy walled quartz ampoule which was evacuated and then sealed as in Example 2, taking care not to heat the arsenic. The ampoule was heated to 800° C. for about 10 min until the arsenic dissolved into the melt.

B. Use of Alloys in Liquid Metal Ion Sources

1. Boron Alloys

Boron is an element with a very high melting point of 2,200° C. A liquid is needed at a temperature compatible with the supporting needle structure.

Experience with Au-Si and Au-Ge indicated that eutectic alloys would emit ions of a given element in proportion to their atomic percentage in the alloy. For this reason, a binary composition is desirable, since a simple formulation that contains the greatest fraction of boron would be more likely to emit a higher percentage of the desired element than would a more complex composition.

Example 4: Pt-B

One useful binary eutectic alloy of boron is $Pt_{72}B_{28}$; a sharp depressed eutectic point exists at 28 at.% boron with a melting point of 795° C. The alloy was prepared using procedures similar to those described in Example 1. This alloy was employed in a liquid metal ion source similar to that schematically depicted in FIG. 3. Since the vapor pressures of both boron and platinum are well below $10^{-11}$ Torr at this temperature, no loss of material through vaporization occurred.

Example 5: Pd-Ni-B

Figure 4:
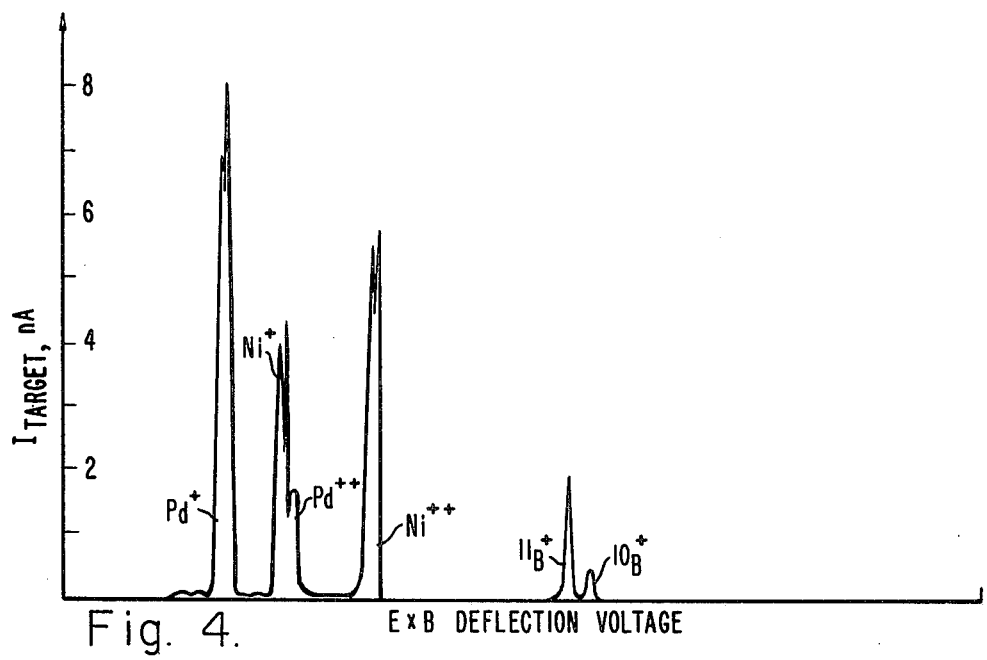
FIG. 4 on coordinates of target current and E×B deflection voltage, depicts the mass spectrum of ions emitted from an alloy of $Pd_{40}Ni_{40}B_{20}$.

A particularly attractive ternary alloy, $Pd_{40}Ni_{40}B_{20}$, with a melting point of about 675° C., prepared from Example 1, was employed in apparatus similar to that described in Example 4, using a rhenium needle and an E×B mass separator. Over several hours, a fairly stable extracted ion current on 10 μA at 13 kV was observed in the source assembly. A mass spectrum of the emitted ions is depicted in FIG. 4, which plots the current of the target in nanoamps and the E×B deflection voltage. The two boron peaks correspond to the two isotropes, $^{11}B^+$ and $^{10}B^+$, and they appear in their proper ratio of natural abundance. The sum of the two boron peaks roughly corresponds with the expected 20 atomic % of emitted boron.

2. Arsenic Alloys

Arsenic in liquid form has not been available because of the high rate of evaporation of arsenic at elevated temperatures. Arsenic has a vapor pressure of over 20 atm at its melting point of 820° C. This vapor pressure must be reduced by a factor of more than $10^4$ to make a liquid alloy suitable for use in a vacuum.

The requisite vapor pressure reduction is accomplished by selecting alloy systems that can strongly suppress the vaporization of arsenic at high temperature by chemical bonding.

Example 6: Pd-Ni-As-B

A quaternary alloy was made by substituting part of the boron in Pd-Ni-B with arsenic (Example 2). The alloy was employed in apparatus similar to that described in Example 4, using a tungsten carbide needle and an E×B mass separator.

Figure 5:
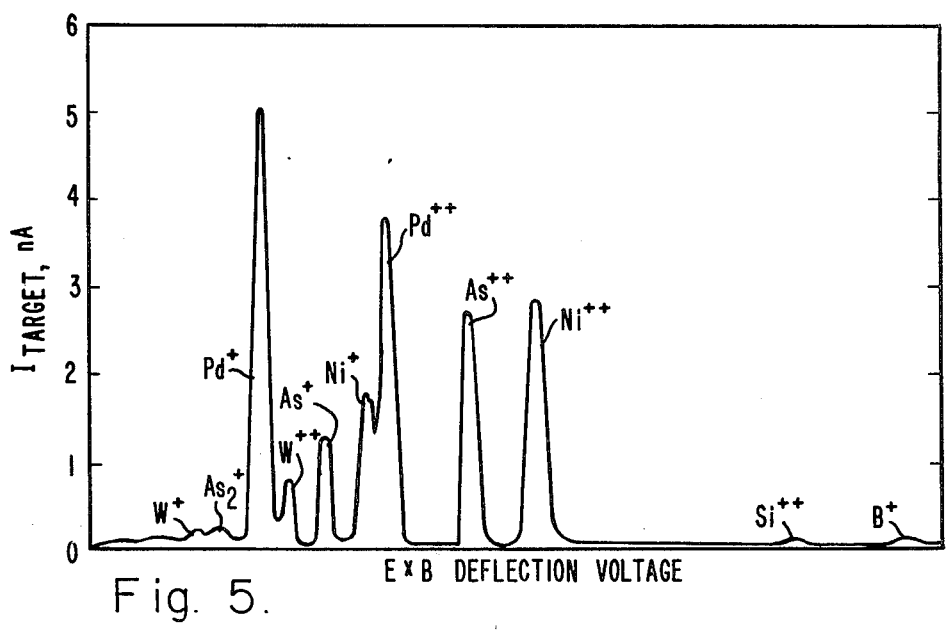
FIG. 5, on coordinates of target current and E×B deflection voltage, depicts the mass spectrum of ions emitted from an alloy of $Pd_{40}Ni_{40}As_{10}B_{10}$.

Ion emission at 10 kV and 12 to 15 μA was stable for several hours. The mass spectrum of the emitter ions is depicted in FIG. 5 on coordinates of target current in nanoamps and E×B deflection voltage, and shows both singly and doubly charged arsenic were produced in roughly equal quantities (the height of the $As^{++}$ peak must be divided by two, since the collector is measuring charges per second, or current). An added attraction of this alloy is the possibility of generating both boron and arsenic ions from one alloy. While boron was produced in amounts lower than expected from its atom fraction, this apparently was caused by spurious factors unrelated to the use of an alloy for generating two ionic species.

Examples 7-9: Other Alloys

The alloys shown in the Table below were prepared, employing methods similar to those disclosed in connection with Example 1. The alloys were then employed in apparatus similar to that described in Example 4, with the ions observed by mass spectrum analysis as shown.

| Example | Source | Ions of Interest Observed |
|---|---|---|
| 7 | $Au_{82}Si_{18}$ | $Si^{++}$, $Si^+$ |
| 8 | $Au_{50}Be_{50}$ | $Be^{++}$ |
| 9 | $Au_{73}Ge_{27}$ | $Ge^{++}$ |

What is claimed is:

1. A liquid metal ion source comprising:
    (a) an anode electrode for supporting an ion emitter comprising an alloy in the liquid state and having a termination such that at least one cusp of liquid metal will form under the influence of an electric field;
    (b) means for generating an ionizing electric field; and
    (c) a reservoir for said liquid metal, ions of which are to be emitted by said source, characterized in that said alloy is one selected from the group consisting of (a) metal-metalloid alloys comprising about 10 to 30 atom percent of at least one metalloid element the balance at least one transition element, (b) early transition-late transition alloys comprising about 30 to 85 atom percent of at least one early transition element, the balance at least one late transition element, and (c) Group II alloys comprising about 35 to 80 atom percent of at least one Group II element, the balance at least one metal element.

2. The liquid metal ion source of claim 1 in which said alloy has a vapor pressure less than about $10^{-5}$ Torr at its melting point.

3. The liquid metal ion source of claim 1 in which said alloy consists essentially of a metal-metalloid alloy consisting essentially of about 10 to 30 atom percent of at least one metalloid element selected from the group consisting of aluminium, arsenic, boron, carbon, germanium, indium, phosphorus, silicon and tin and the balance at least one transition element.

4. The liquid metal ion source of claim 3 in which said alloy consists essentially of about 10 to 30 atom percent of at least one element selected from the group consisting of arsenic, boron, germanium and silicon and the balance at least one transition metal element selected from the group consisting of nickel, palladium, platinum, lanthanum and gold.

5. The liquid metal ion source of claim 4 in which said alloy is selected from the group consisting of $Ni_{40}Pd_{40}B_{20}$, $Pt_{80}B_{20}$, $Pt_{72}As_{28}$, $Ni_{40}Pd_{40}As_{10}B_{10}$, $La_{80}C_{20}$, $Au_{82}Si_{18}$ and $Au_{73}Ge_{27}$.

6. The liquid metal ion source of claim 1 in which said alloy consists essentially of an early transition-late transition alloy consisting essentially of about 30 to 85 atom percent of at least one early transition metal selected from the group consisting of zirconium, niobium, tantalum and titanium and the balance at least one late transition metal selected from the group consisting of iron, cobalt, nickel, copper and palladium.

7. The liquid metal ion source of claim 7 in which said alloy consists essentially of about 35 to 80 atom percent of at least one Group II metal selected from the group consisting of beryllium, calcium, magnesium and zinc and the balance at least one metal selected from other Group II metals, aluminum, titanium, zirconium, hafnium and gold.

8. The liquid metal ion source of claim 7 in which said alloy is $Be_{50}Au_{50}$.

9. A process for altering properties of materials by ion bombardment with selected ionic species which comprises exposing a material to an ion beam generated from a liquid metal ion source employing as the liquid metal an alloy selected from the group consisting of (a) metal-metalloid alloys comprising about 10 to 30 atom percent of at least one metalloid element, the balance at least one transition element, (b) early transition-late transition alloys comprising about 30 to 85 atom percent of at least one early transition element, the balance at least one late transition element, and (c) Group II alloys comprising about 35 to 80 atom percent of at least one Group II element, the balance at least one metal element.

10. The process of claim 9 in which said alloy has a vapor pressure less than about $10^{-5}$ Torr at its melting point.

11. The process of claim 9 in which said alloy consists essentially of a metal-metalloid alloy consisting essentially of about 10 to 30 atom percent of at least one metalloid element selected from the group consisting of aluminium, arsenic, boron, carbon, germanium, indium, phosphorus, silicon and tin and the balance at least one transition element.

12. The process of claim 11 in which said alloy consists essentially of about 10 to 30 atom percent of at least one element selected from the group consisting of arsenic, boron, germanium and silicon and the balance at least one transition metal element selected from the group consisting of nickel, palladium, platinium, lanthanum and gold.

13. The process of claim 12 in which said alloy is selected from the group consisting of $Ni_{40}Pd_{40}B_{20}$, $Pt_{72}As_{28}$, $Ni_{40}Pd_{40}As_{10}B_{10}$, $La_{80}C_{20}$, $Au_{82}Si_{18}$ and $Au_{73}Ge_{27}$.

14. The process of claim 9 in which said alloy consists essentially of an early transition-late transition alloy consisting essentially of about 30 to 85 atom percent of at least one early transition metal selected from the group consisting of zirconium, niobium, tantalum and titanium and the balance at least one late transition metal selected from the group consisting of iron, cobalt, nickel, copper and palladium.

15. The process of claim 9 in which said alloy consists essentially of about 35 to 80 atom percent of at least one Group II metal selected from the group consisting of beryllium, calcium, magnesium and zinc and the balance at least one metal selected from other Group II metals, aluminum, titanium, zirconium, hafnium and gold.

16. The process of claim 15 in which said alloy is $Be_{50}Au_{50}$.

* * * * *